US005627726A

United States Patent [19]

David et al.

[11] Patent Number: 5,627,726

[45] Date of Patent: May 6, 1997

[54] ELECTRONIC CARD WITH PRINTED CIRCUIT BOARD AS OUTER SURFACE

[75] Inventors: Morton E. David, Montclair; Paul K. Kavanaugh, Eastampton; Ngoc M. Luong, Maple Shade, all of N.J.

[73] Assignee: Franklin Electronic Publishers, Inc., Burlington, N.J.

[21] Appl. No.: 511,738

[22] Filed: Aug. 7, 1995

[51] Int. Cl.$^6$ ........ G06F 1/16; H05K 7/04

[52] U.S. Cl. ........ 361/684; 361/736

[58] Field of Search ........ 361/679, 684, 361/686, 736, 737; 364/708.1; G06F 1/16

[56] References Cited

U.S. PATENT DOCUMENTS

| | | | |
|---|---|---|---|
| 4,912,604 | 3/1990 | Vaisanen | 361/736 |
| 5,055,968 | 10/1991 | Nishi et al. | 361/737 |
| 5,363,274 | 11/1994 | Omori et al. | 361/736 |

FOREIGN PATENT DOCUMENTS

| | | | |
|---|---|---|---|
| 401151294 | 6/1989 | Japan | 361/813 |

*Primary Examiner*—Leo P. Picard
*Assistant Examiner*—Lynn D. Feild
*Attorney, Agent, or Firm*—McAulay Fisher Nissen Goldberg & Kiel, LLP

[57] ABSTRACT

A removable card for use with an electronic device for processing information. The removable card contains a base and a circuit board. The base include a first surface and a second surface. The circuit board contains a plurality of components and also includes a first surface and a second surface. The first surface of the circuit board exclusively contains the plurality of components and is attached to the first surface the base. The second surface of the base and the second surface of the circuit board are exterior surfaces on the removable card.

14 Claims, 7 Drawing Sheets

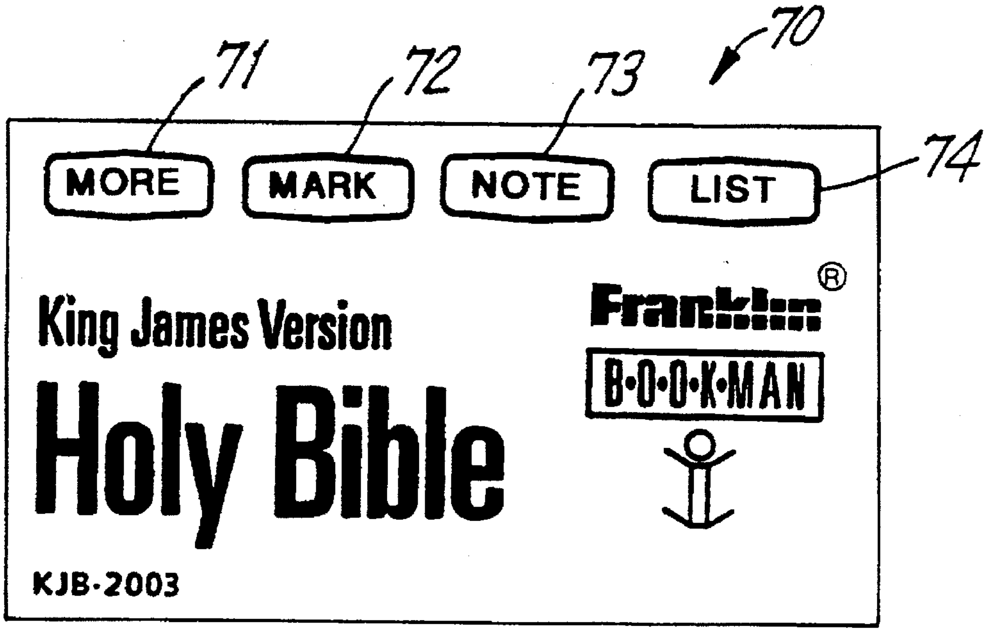

FIG. 13

75

THE HOLY BIBLE/KING JAMES VERSION
BOOKMAN MODEL KJB-2003
1989-1994 FRANKLIN ELECTRONIC PUBLISHERS.INC
Mt. Holly,NJ08060 Mt. Holly,NJ08060 U S A All rights reserved
Complies with the limits for a Class B computing device pursuant to Subpart B of Part 15 of FCC Rule
Operation is subject to the following two conditions (1) This device may not cause harmful interference. and (2) This device must accept any interference received including interference that may cause undesired operation
Scripture taken from the Scripture HOLY BIBLE.KINGJAMES VERSION

FIG. 14

ELECTRONIC CARD WITH PRINTED CIRCUIT BOARD AS OUTER SURFACE

BACKGROUND

A) Field of Invention

The present invention relates to an electronic device for processing information, and more particularly to an electronic device for processing information which contains a removable card.

B) Description of Related Art

Electronic devices for processing information are currently available which perform a variety of functions. FIG. 1 shows a conventional device 10 which can, for example, perform the function of either a dictionary, encyclopedia or bible. A rear surface 11 of the device 10, as shown in FIG. 2, includes a recess 12 which supports a removable card. The function performed by the device 10 depends on the type of removable card inserted into the recess 12. Specifically, should a user desire the device 10 to function as a dictionary, then a removable card containing dictionary-related information is inserted into the recess 12. Alternatively, should a user desire the device 10 to function as an encyclopedia, then a removable card containing information relating to an encyclopedia is inserted into the recess 12.

FIG. 3 shows an exploded view of a conventional removable card 20. The conventional removable card 20 generally includes five components: (i) a first plate 21, (ii) a first case 22, (iii) a printed circuit board 23, (iv) a second case 24, and (v) a second plate 25.

The first plate 21 is made of polyvinyl chloride or metal and is attached to the first case 22 by an adhesive. An outer surface of the first plate 21, although not shown in FIG. 3, generally includes a logo or other marketing information.

The first case 22 is a plastic material which includes recesses 26. The first case 22 also includes hinges 27 and guides 28. The hinges 27 are positioned to project from a front surface of the first case 22 where the guides 28 project from side surfaces. Additionally, a resilient U-shaped device 29 is attached to the first case 22. The U-shaped device 29 includes a first side 30 which is attached to a back surface of the first case 22, and a second side 31 which defines a channel 32.

The printed circuit board 23 contains electronic components 33 on both its upper and lower surfaces. Also provided on the printed circuit board 23 are gold pads 34 and gold contacts contacts 35. The printed circuit board 23 is positioned above the first case 22. As a result, when the removable card 20 is assembled, components 33 located on the lower surface of the printed circuit board 23 are fit into the recesses 26 provided on the first case 22.

The second case 24 is positioned above the printed circuit board 23 and contains recesses 36. Thus, components 33 located on the upper surface of the printed circuit board 23 are fit into the recesses 36. Also, during assembly, the first case 22 and second case 24 are ultrasonically welded together to secure the printed circuit board 23.

A second plate 25 is attached to the second case 24 with an adhesive to complete the assembly of the removable card 20. The second plate 25 is typically made of stainless steel.

Referring again to FIG. 2, the recess 12 contains a number of components which interface with the removable card 20. Specifically, the recess 12 includes pins 13 which provide a DC power supply. The pins 13 are positioned such that they contact the gold pads 34 on the printed circuit board 23 when the removable card 20 is inserted into the recess 12.

A conducting strip 14 is also provided in the recess 12. The conducting strip 14 connects the gold contacts 35 on the printed circuit board 23 with contacts inside the device 10 which are not shown. The conducting strip 14 is an elastomeric connector which uses a silver impregnation to achieve a low initial resistance of 0.1 ohms.

Hinge slots 15 are also included in the recess 12 to receive the hinges 27 provided on first case 22 of the removable card 20. Similarly, guide slots 16 are provided in the recess 12 to receive the guides 28. A prong 17 overlaps the recess 12 and engages the channel 32 provided on the U-shaped device 30 when removable card 20 is inserted into the recess 12.

The above-described removable card 20 does, however, have certain drawbacks. In particular, the removable card 20 contains a large number of parts which increase the cost of the removable card 20 and, additionally, make the removable card 20 difficult and expensive to manufacture. Also, by having an excess number of parts, the removable card 20 undesirably adds to the weight of the device 10.

OBJECTS AND SUMMARY OF THE INVENTION

It is accordingly an object of the present invention to provide a removable card which contains a small number of parts and which can be easily and inexpensively manufactured. It is another object of the invention to provide a removable card which is light in weight.

In accordance with one aspect of the invention, an electronic device for processing information is defined, where the device comprises a frame with a recess, and a removable card for insertion into the recess. The removable card includes a base and a circuit board. The base comprises (i) a first surface and (ii) a second surface. The circuit board contains a plurality of components and comprises (i) a first surface exclusively containing the plurality of components, where the first surface of the circuit board is attached to the first surface of the base, and (ii) a second surface. The second surface of the base and the second surface of the circuit board are exterior surfaces on the removable card.

In accordance with another aspect of the invention, the first surface of the base defines a first recess and a second recess, whereas, the first surface of the circuit board defines a first area and a second area. The first area of the circuit board is fit into the first recess of the base, and, the plurality of components are positioned exclusively within the second area of the circuit board and fit into the second recess of the base.

In accordance with yet another aspect of the invention, geometric configurations defined by the first and second recesses in the base are respectively identical to geometric configurations defined by the first and second areas of the circuit board.

BRIEF DESCRIPTION OF THE DRAWINGS

The accompanying drawings are included to provide an understanding of the invention and constitute a part of the specification.

FIG. 13 shows a label which is placed on a top surface of the removable card shown in FIG. 5; and, FIG. 14 shows a label which is placed on a bottom surface of the removable card shown in FIG. 4.

DETAILED DESCRIPTION OF THE INVENTION

Figure 4:
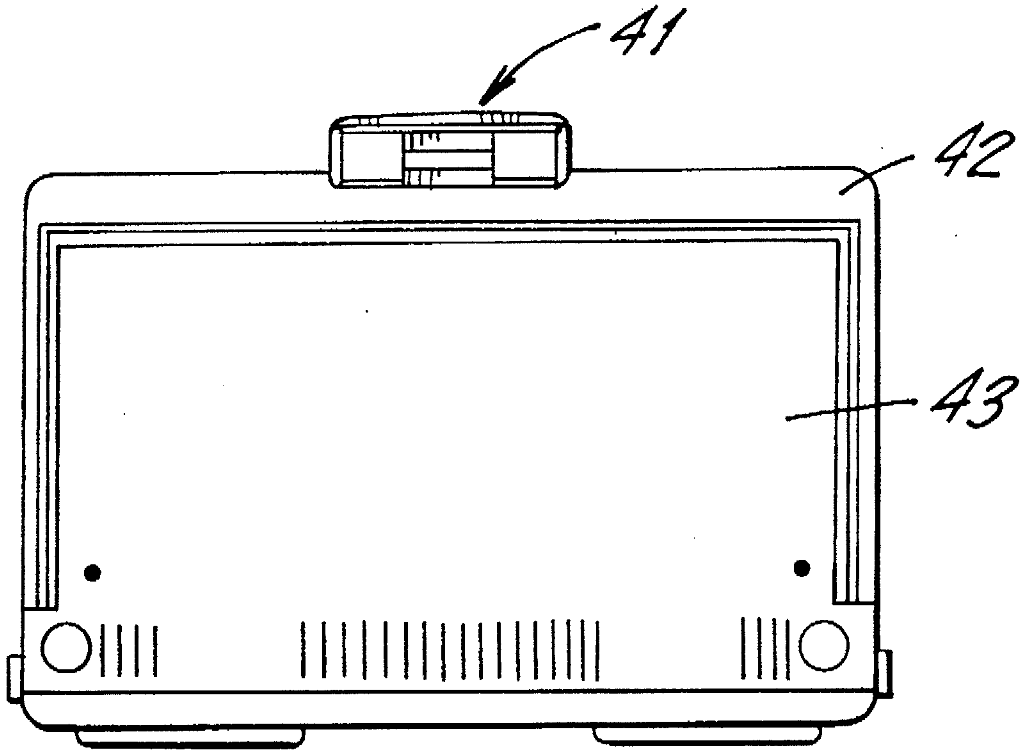
FIG. 4 illustrates a bottom view of a removable card in accordance with the present invention.

FIG. 4 shows a removable card 41 in accordance with the present invention. Unlike the conventional removable card described above, the removable card 41 contains only two components. Specifically, the removable card 41 contains a base 42 and a printed circuit board 43. The removable card 41 is described in detail below.

Figure 7:
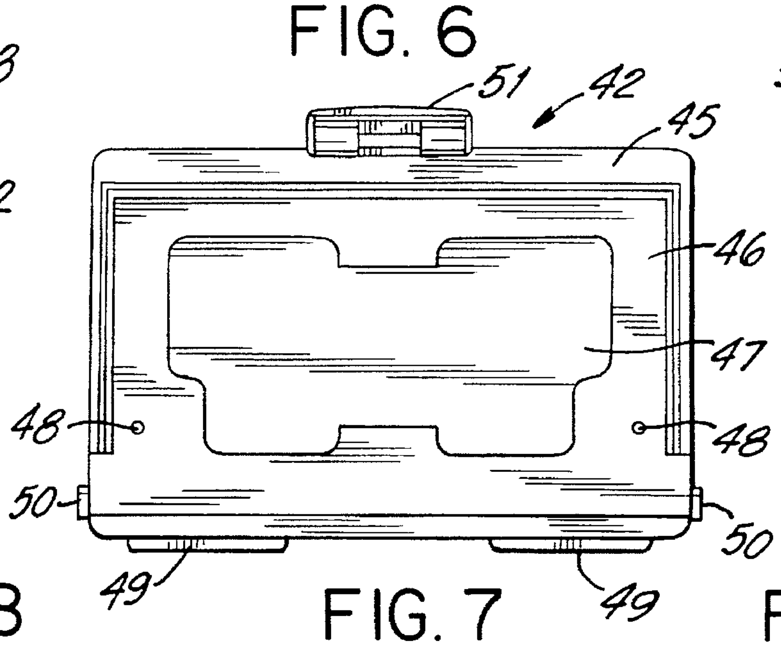
FIG. 7 illustrates the removable card shown in FIG. 4 without a printed circuit board.
Figure 9:
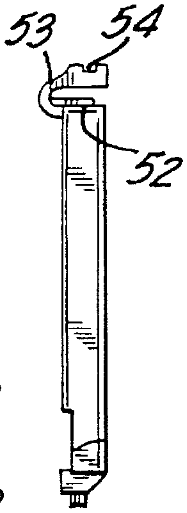
FIG. 9 illustrates a right side view of FIG. 7.
Figure 10:
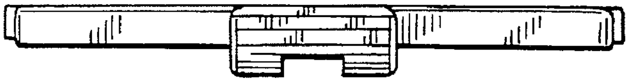
FIG. 10 illustrates a rear view of FIG. 5.

FIG. 7 illustrates the removable card 41 shown in FIG. 4 without the printed circuit board 43. Referring to FIG. 7, a bottom surface 45 of the base 42 includes a two-tiered recess. In particular, the bottom surface 45 includes a first recess 46 and a second recess 47. The first recess 46 supports the printed circuit board 43 and maintains a depth sufficient to accommodate a thickness of the printed circuit board 43 and an adhesive which is approximately 0.95 mm. The second recess 47, which is positioned beneath the first recess 46, is additionally provided to accommodate components placed on a bottom surface of the printed circuit board 43. The thickness of the second recess is approximately 1.65 mm.

The base 42 includes a number of other components as well. Specifically, the base 42 includes circular posts 48, hinges 49 and guides 50. The base 42 also includes a resilient U-shaped device 51. The U-shaped device 51 includes a first side 52 which is attached to a rear surface of the base 42, and a second side 53 which defines a channel 54.

Figure 5:
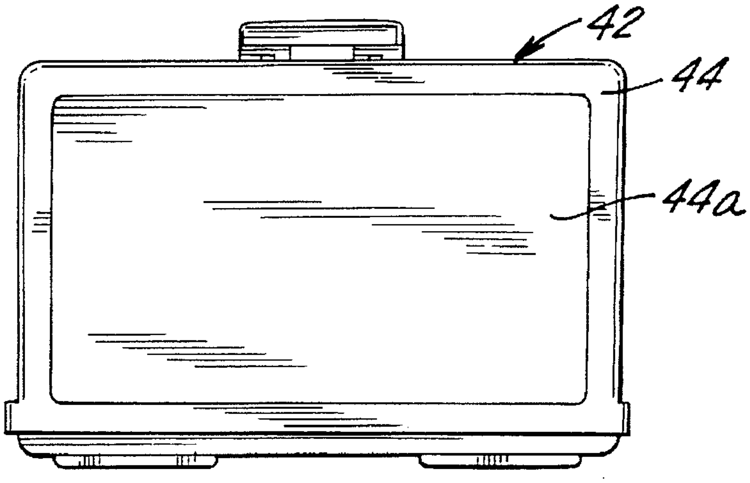
FIG. 5 illustrates a top view of a removable card in accordance with the present invention.
Figure 6:
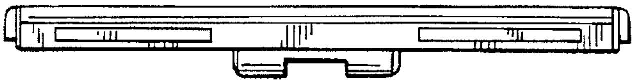
FIG. 6 illustrates a front view of the removable card shown in FIG. 5.
Figure 8:
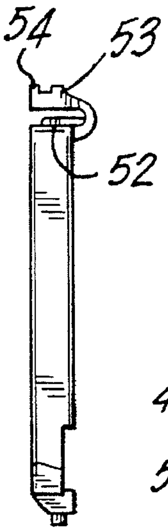
FIG. 8 illustrates a left side view of FIG. 7.

FIG. 5 shows a top surface 44 of a the base 42. The top surface 44 includes a recess 44a which, as will be described in detail below, is provided to accommodate a label including information about either the contents or operational characteristics of the removable card 41.

Figure 11:
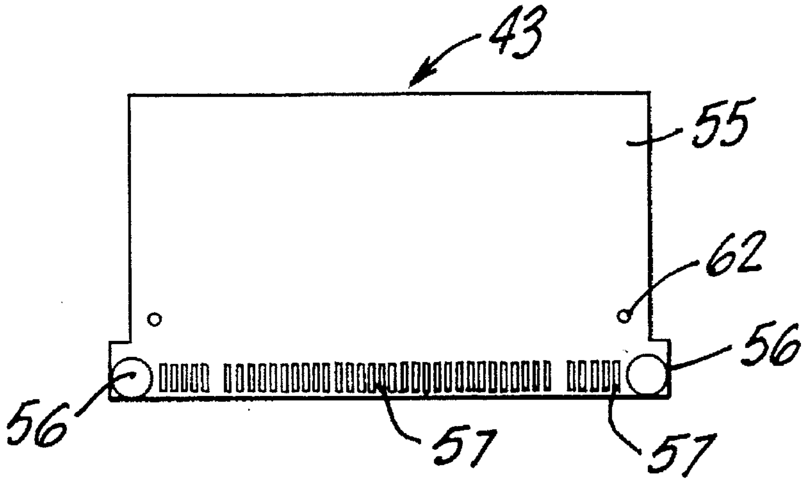
FIG. 11 illustrates a top surface of a printed circuit board used in the removable card shown in FIG. 4.
Figure 12:
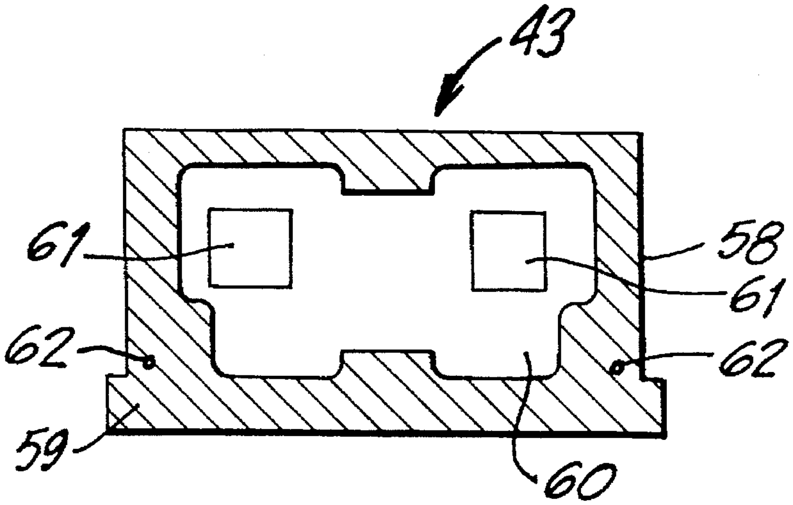
FIG. 12 illustrates a bottom surface of a printed circuit board used in the removable card shown in FIG. 4.

FIGS. 11 and 12 respectively show top and bottom views of the printed circuit board 43.

Referring to FIG. 11, a top surface 55 of the printed circuit board 43 includes gold pads 56 and gold contacts 57. The gold pads 56 and gold contacts 57 are flush with the top surface 55 of the printed circuit board 43. As a result, the top surface 55 defines a smooth planar surface. Thus, when the printed circuit board 43 is attached to the base 42, as shown in FIG. 4, the top surface 55 of the printed circuit board 43 becomes an exterior surface of the removable card 41.

FIG. 12 shows a bottom surface 58 of the printed circuit board 43. Referring to FIG. 12, the bottom surface 58 of the printed circuit board 43 includes a first area 59 and a second area 60. The first area 59 contains an adhesive to secure the printed circuit board 43 to the base 42. The second area 60 defined on the printed circuit board 43 is an area which exclusively contains electrical components 61. That is, any electrical components provided on the printed circuit board 43 are located within the second area 60. When the circuit board 43 is attached to the base 42, holes 62 provided in the printed circuit board 43 are aligned with the circular posts 48 provided on the base 42.

The first and second areas 59 and 60 maintain geometric configurations which are respectively identical to the geometric configurations of the first and second recesses 46 and 47 described above with reference to FIG. 7. As a result, upon assembly of the removable card 41, the first area 59 is aligned with the first recess 46 and the second area 60 is aligned with the second recess 47. Additionally, this configuration fits electrical components 61, which project from the second area 60, into the second recess 47.

Once the removable card 41 is assembled, various labels can be applied to its outer surfaces with information that will be of value to either the user or manufacturer of the removable card.

FIG. 13 is an example of a label 70 which is applied in recess 44a described above with reference to FIG. 5. The label 70 conveys information to the user about the the contents and functions of the removable card 41. In this particular example, the label 70 informs the user that the removable card 41 contains information which relates to a King James Version of the Holy Bible. Additionally, the label 70 contains boxes 71 through 74 which, although not apparent from the drawings, are color-coded. For example, box 71 is coded with the color red and recites the term "MORE." This information tells the user that a red key on the device 10, when using this specific removable card 41, performs a "MORE" function as defined by a users's manual for the device 10.

FIG. 14 is an example of a label 75 that is applied to the top surface 55 of the printed circuit board 43 after it has been attached to the base 42. The label 75 contains information identifying the manufacturer of the removable card 41 as well as any necessary legal notices.

Figure 1:
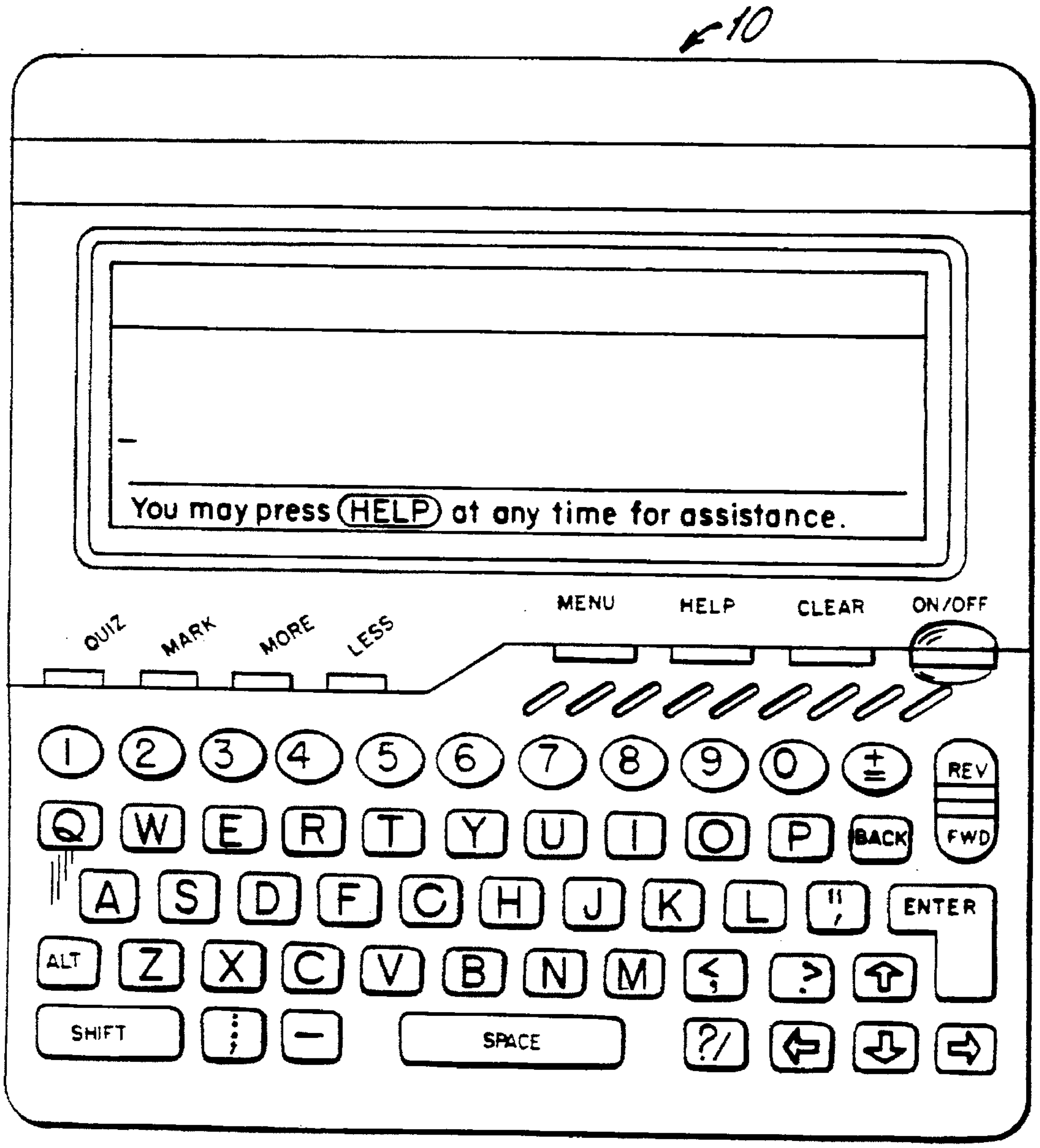
PRIOR ART FIG.1
FIG. 1 illustrates a conventional electronic device.
Figure 2:
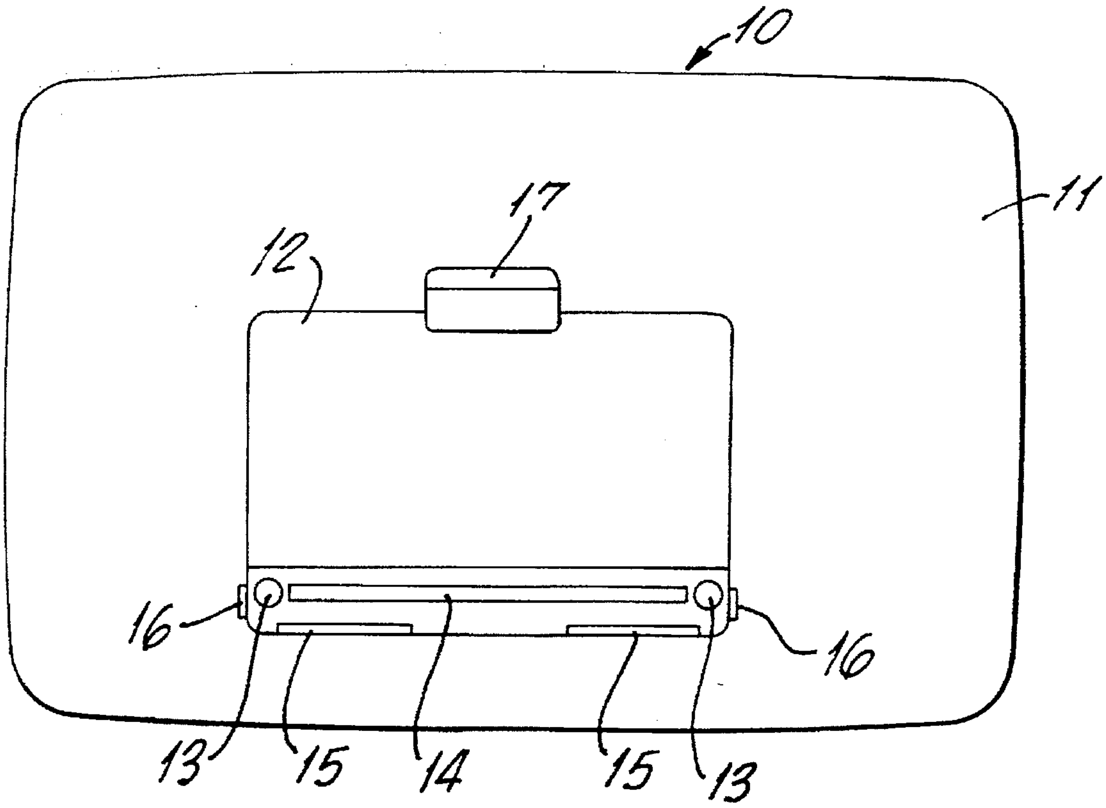
FIG. 2 PRIOR ART
FIG. 2 illustrates a rear surface of the conventional electronic device shown in FIG. 1.
Figure 3:
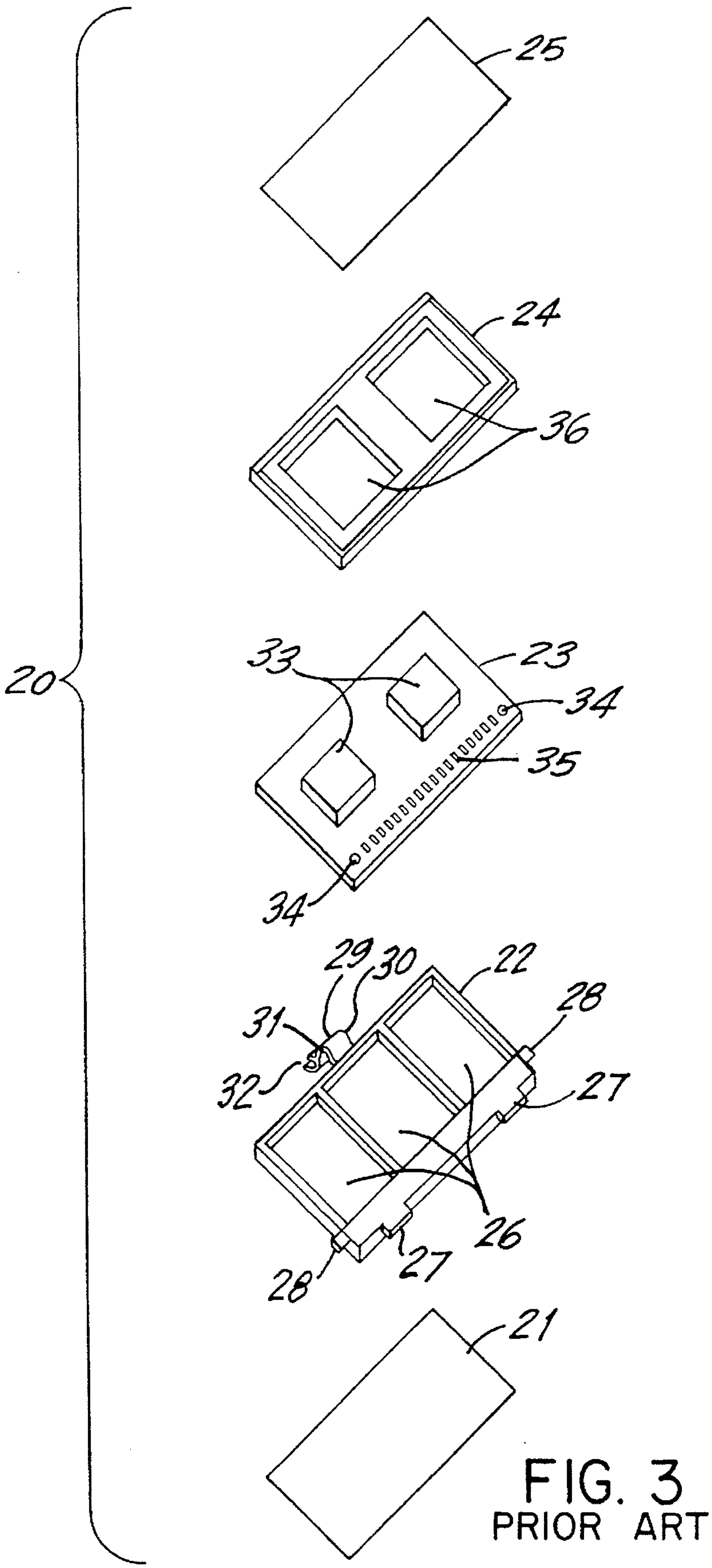
FIG. 3 PRIOR ART
FIG. 3 illustrates an exploded view of a conventional removable card used with the electronic device shown in FIGS. 1 and 2.

Upon insertion of the removable card 41 into the recess 12 of the device 10, as shown in FIG. 3, each of the components contained on the removable card 41 interface with the components provided in the recess 12. Specifically, the gold pads 56 engage the power supply pins 13 and the gold contacts 57 engage the conducting strip 14. Also, hinges 49 provided on the base 42 are received by hinge slots 15, guides 50 are received by guide slots 16, and the prong 17 which overlaps the recess 12 is engaged by the channel 54 provided on the U-shaped device 51.

The removable card 41 described herein contains several advantages over conventional removable cards. Most notably, the removable card 41 contain a fewer number of parts as compared to conventional cards which results in lower component costs and lower manufacturing costs. Also, by having a fewer number of parts, the removable card 41 maintains a reduced weight.

The present invention is not to be considered limited in scope by the preferred embodiments described in the specification. Additional advantages and modifications, which will readily occur to those skilled in the art from consideration of the specification and practice of the invention, are intended to be within the scope and spirit of the following claims.

We claim:

1. An electronic device for processing information, said device comprising:

a frame with a recess; and, a removable card for insertion into said recess, said removable card including:

a) a base comprising (i) a first surface and (ii) a second surface; and b) a circuit board comprising (i) a first surface which exclusively includes a plurality of components, and (ii) a second surface which includes an electrical connection means;

wherein, said first surface of said circuit board is attached to said first surface of said base and said second surface of said circuit board functions as an exterior surface on said removable card.

2. An electronic device as defined in claim 1, where:

(a) said first surface of said base defines a first recess and a second recess; and, (b) said first surface of said circuit board defines a first area and a second area, wherein (i) said first area of said circuit board is fit into said first recess of said base and (ii) said plurality of components are positioned exclusively within said second area of said circuit board and fit into said second recess of said base.

3. An electronic device as defined in claim 2, wherein geometric configurations defined by said first and second recesses in said base are respectively identical to geometric configurations defined by said first and second areas of said circuit board.

4. An electronic device as defined in claim 3, where:

said recess in said frame of said device defines a hinge slot, a guide slot, and a prong, and said base of said removable card further comprises a hinge, a guide, and a securing means for securing said removable card to said frame, wherein, upon insertion of said removable card into said recess on said frame of said device, said hinge is inserted into said hinge slot, said guide is inserted into said guide slot, and said securing means is is engaged by said prong to secure said removable card.

5. An electronic device as defined in claim 4, wherein said securing means is a resilient U-shaped device including:

a first side which is attached to a front surface of said base; and a second side which defines a channel to receive said prong.

6. An electronic device as defined in claim 3, wherein a label is placed on said second surface of said base, said label containing information describing operational characteristics of said removable card.

7. An electronic device as defined in claim 3, wherein a label is placed on said second surface of said base, said label containing information describing contents of said removable card.

8. A removable card for use with an electronic device or processing information, said removable card comprising:

a base including (i) a first surface and (ii) a second surface; and, a circuit board comprising (i) a first surface which exclusively includes a plurality of components, and (ii) a second surface which includes an electrical connection means;

wherein, said first surface of Said circuit board is attached to said first surface of said base and said second surface of said circuit board functions as an exterior surface on said removable card.

9. A removable card as defined in claim 8, where:

(i) said first surface of said base defines a first recess and a second recess; and, (ii) said first surface of said circuit board defines a first area and a second area, wherein (i) said first area of said circuit board is fit into said first recess on said base and (ii) said plurality of components are positioned exclusively within said second area of said circuit board and fit into said second recess of said base.

10. A removable card as defined in claim 9, wherein geometric configurations defined by said first and second recesses in said base are respectively identical to geometric configurations defined by said first and second areas of said circuit board.

11. A removable card as defined in claim 10 further comprising:

a securing means for securing said removable card to the device, said securing means being attached to a front surface of said base;

a hinge which is attached to a rear surface of said base, and;

a guide which is attached to side surfaces of said base.

12. A removable card as defined in claim 11, wherein said securing means is a resilient U-shaped device including:

a first side which is attached to said front surface of said base; and a second side which defines a channel to engage a portion of the device.

13. A removable card as defined in claim 10, wherein a label is placed on said second surface of said base, said label containing information describing operational characteristics of said removable card.

14. A removable card as defined in claim 10, wherein a label is placed on said second surface of said base, said label containing information describing contents of said removable card.

* * * * *